United States Patent [19]

Goffredo et al.

[11] 3,935,041
[45] Jan. 27, 1976

[54] METHOD FOR TREATMENT FLUID APPLICATION AND REMOVAL

[75] Inventors: Daniel L. Goffredo, Riverton, N.J.; Conrad Dale Shakley, Spring Mills, Pa.

[73] Assignee: Chemcut Corporation, State College, Pa.

[22] Filed: Jan. 2, 1974

[21] Appl. No.: 430,197

Related U.S. Application Data

[63] Continuation-in-part of Ser. No. 189,895, Oct. 18, 1971, Pat. No. 3,801,387.

[52] U.S. Cl. .............. 156/18; 96/48 PD; 134/37; 156/19; 156/23; 156/345; 427/424
[51] Int. Cl.² .... B08B 7/04; B05C 5/00; C23F 1/00; G03C 5/24
[58] Field of Search ............ 156/2, 18, 19, 23, 345; 134/37; 15/302; 96/48 PD; 427/424; 148/1, 6.2, 6.3, 6.35

[56] References Cited
UNITED STATES PATENTS

| | | |
|---|---|---|
| 2,155,932 | 4/1939 | Davis .............................. 156/4 |
| 2,523,018 | 9/1950 | Henderson ..................... 134/37 X |
| 2,822,635 | 2/1958 | Mears ............................ 156/8 |
| 3,174,491 | 3/1965 | Faler ............................. 134/37 X |
| 3,526,546 | 9/1970 | Heiss ............................ 134/37 X |
| 3,544,366 | 12/1970 | Uhlmann ...................... 134/37 X |

Primary Examiner—William A. Powell
Attorney, Agent, or Firm—Paul & Paul

[57] ABSTRACT

Treated articles such as printed circuit boards that have been etched with an etchant or treated with a solvent, are delivered into a zone of sufficiently high humidity to prevent drying of a liquid treatment fluid on the articles, and wherein the treatment fluid is "blown off" the articles by pressurized air, in the high humidity environment, with the treatment fluid then being delivered for re-use at a prior station. Alternately, the treatment fluid is atomized, entrained in the pressurized air stream and "blown on" the articles, whereby the treatment fluid is efficiently and uniformly applied thereto.

23 Claims, 7 Drawing Figures

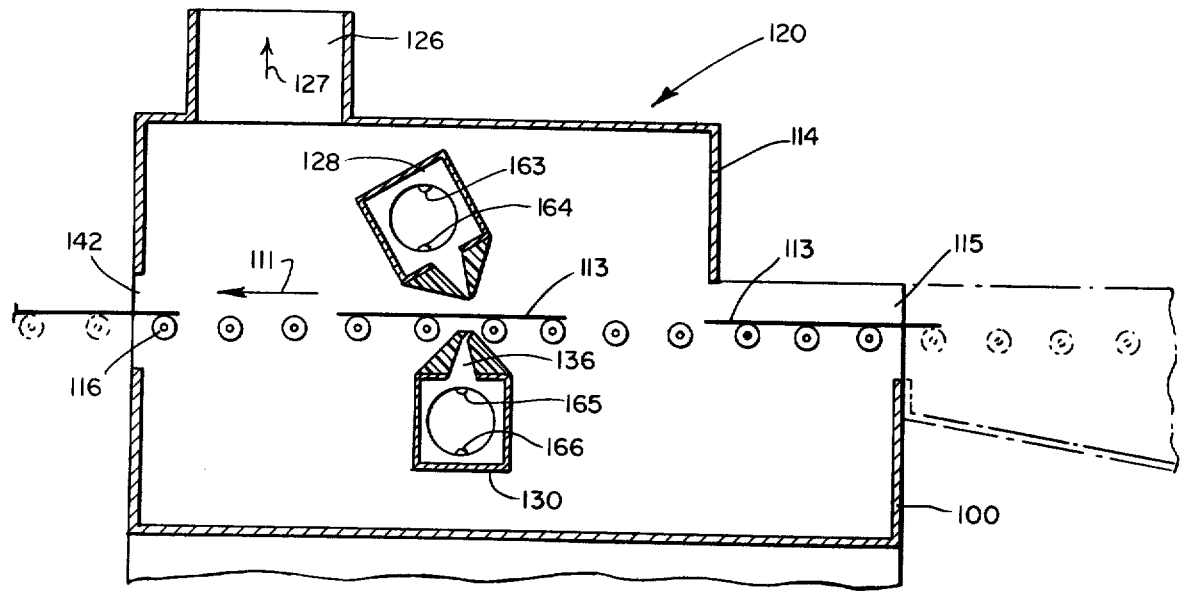
_Fig. 6_
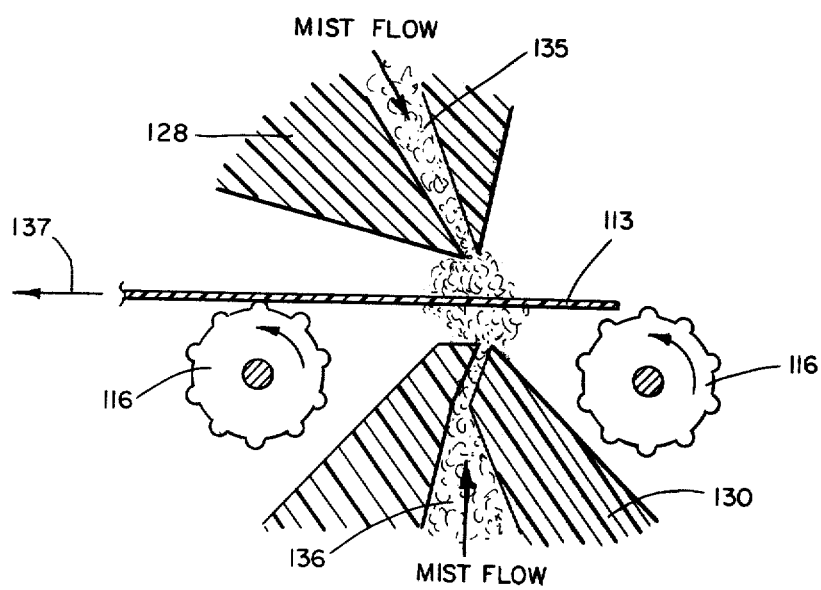
_Fig. 7_

METHOD FOR TREATMENT FLUID APPLICATION AND REMOVAL

CROSS REFERENCE TO RELATED APPLICATION

This application is a Continuation-In-Part of my copending application Ser. No. 189,895, filed Oct. 18, 1971, now U.S. Pat. No. 3,801,387.

BACKGROUND OF THE INVENTION

In the art of etching printed circuit boards, the boards are generally masked, to prevent etching of copper portions thereof, with unmasked portions of the board having copper portions etched by an acid, such as ferric chloride or the like. For purposes of this invention, such acid may be referred to as "treatment fluid," and is usually in the liquid state. However, the treatment fluid can be any treatment material in a fluid state. Such acid has in the past been applied and thereafter rinsed from the board following an etching operation, thereby contaminating the rinse water, requiring regular discharge of the rinse water, carrying the acid to sewage, and eventually to waterways and the like and thereby contaminating the environment. Furthermore, the etchant or treatment fluid is lost, and not available for re-use, unless an expensive reclamation process is utilized. In any event, prior art techniques have involved substantial expense, either by necessitating the loss of the etchant after use, or necessitating the utilization of expensive reclamation equipment.

Furthermore, in the art of printed circuit board manufacture, the mask or "resist," applied to the printed circuit boards must be removed in a subsequent operation. Such removal is generally effected by the use of a solvent, generally of the alkaline type, for removal of resist of the soluble silkscreen ink or photoresist type, when the resist is of the acid type. Accordingly, the term "treatment fluid" is intended also to encompass solvents and alkaline solutions.

As in the past, following application of etchant to printed circuit boards, water sprays are generally used to remove solvent that remains on the boards following a solvent stripping operation, such water sprays also contaminating sewage, waterways and the like, and furthermore requiring either loss of the solvent or other treatment fluid, or else requiring expensive equipment for reclamation of the same.

SUMMARY OF THE INVENTION

The present invention is directed toward providing a device for utilization either between an etching chamber and a rinsing section, or between a resist stripping station and a subsequent rinsing station associated therewith, in order to physically remove the treatment fluid, be it an etchant, a solvent or the like, physically from the printed circuit boards, prior to spraying the boards with any fluid that would tend to dilute such treatment fluid. Furthermore, another embodiment of the present invention provides a process by which such a treatment fluid can be applied to an article such as a printed circuit board in a uniform and efficient manner.

Accordingly, the present invention is directed toward providing a means whereby articles such as printed circuit boards may have the treatment fluid physically blown therefrom by jets or streams of gas such as air, or the like, in an environment or sufficiently high humidity that the treatment fluid will not dry on the boards, or evaporate therefrom, and preferably for reclamation of such treatment fluid by collecting the same and redelivering the treatment fluid to the zone or equipment from which it came, be it etching equipment, or resist stripping equipment, for re-use.

Furthermore, the present invention alernately provides a process whereby articles such as printed circuit boards may have a treatment fluid applied in such a manner that only a very small amount is required and in such a manner that it will not be economically necessary to recirculate the solution, thereby avoiding the contamination build-up which occurs when recirculation of excess treatment fluid is required. Among the advantages of this novel application process are reduction of wastes, elimination of reclamation or disposal of contaminated treatment fluid and more efficient application of a uniform, thin film of the treatment fluid.

Accordingly, it is an object of this invention to provide a novel apparatus for removing liquid treatment fluid from articles that have been treated, without substantial dilution of the liquid treatment fluid.

It is another object to accomplish the above object wherein the liquid treatment fluid is removed from the articles by blowing the same therefrom.

Furthermore, it is an object of this invention to provide a novel process for uniformly applying treatment fluid to an article in a manner such that a minimal amount of treatment fluid is required.

It is another object to accomplish the preceding object wherein the treatment fluid is applied to the article by blowing atomized particles of the same thereupon.

It is a further object to provide a process for applying a treatment fluid in a manner which does not require recirculation of excess or contaminated fluid, or large scale disposal thereof.

It is a further object of the invention to provide a process for the application of treatment fluid to an article, wherein the application will be of improved uniformity and provide a thin film of treatment fluid on the treated article.

It is a further object of this invention to provide novel method steps and apparatus for accomplishing the objects set forth above, and others as will be apparent more fully hereinafter.

Other objects and advantages of the present invention will be readily apparent to those skilled in the art from a reading of the following brief description of the drawing figures, detailed description of the preferred embodiments, and the appended claims.

IN THE DRAWINGS

Figure 2:
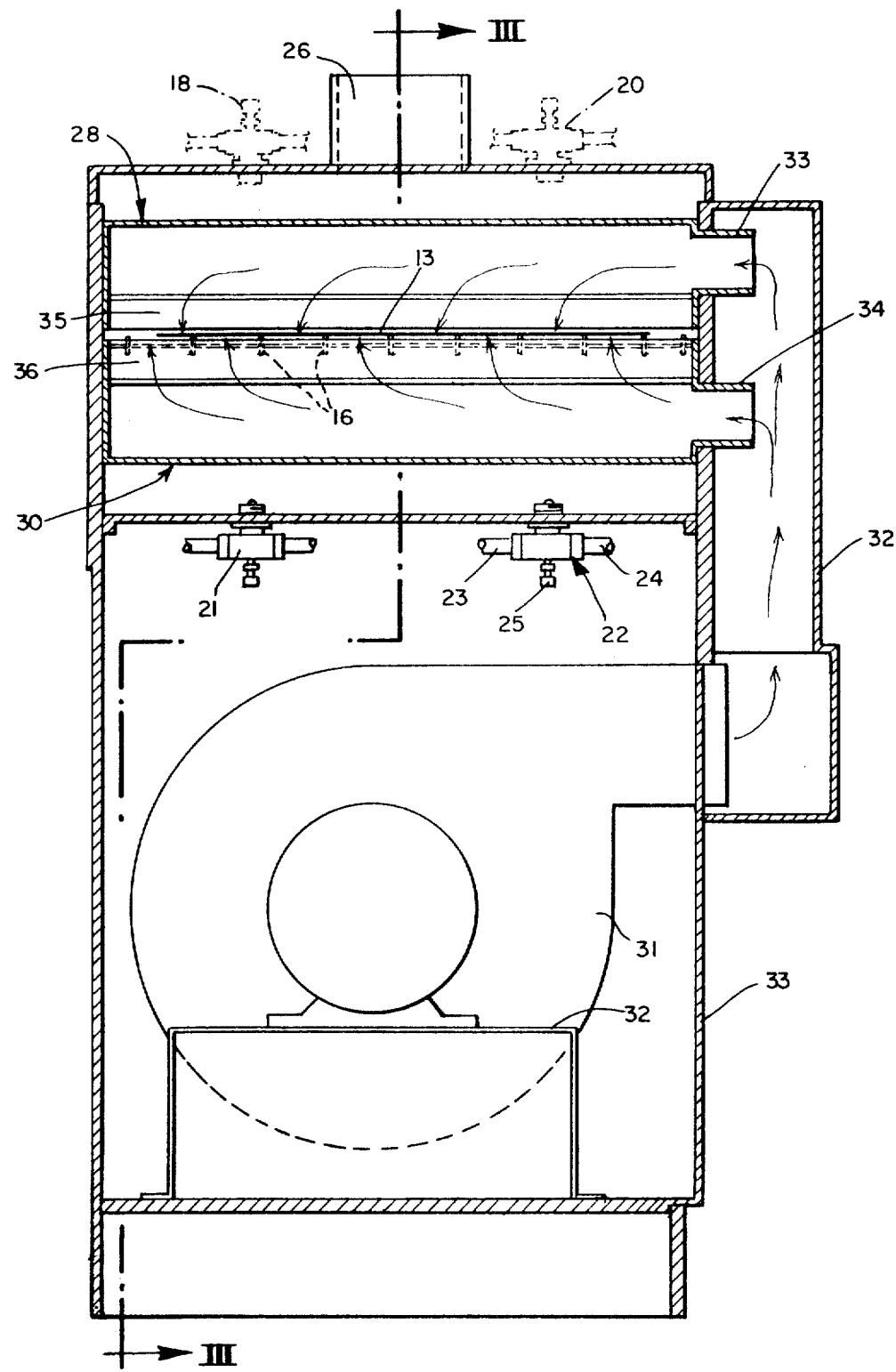
FIG. 2 is an enlarged transverse sectional view taken through the treatment fluid removal station of FIG. 1, generally along the line II—II of FIG. 1, and wherein the air distribution for facilitating the "blow-off" of liquid treatment fluid is more clearly illustrated, and with spray nozzles for creating the high humidity atmosphere being also illustrated.
Figure 5:
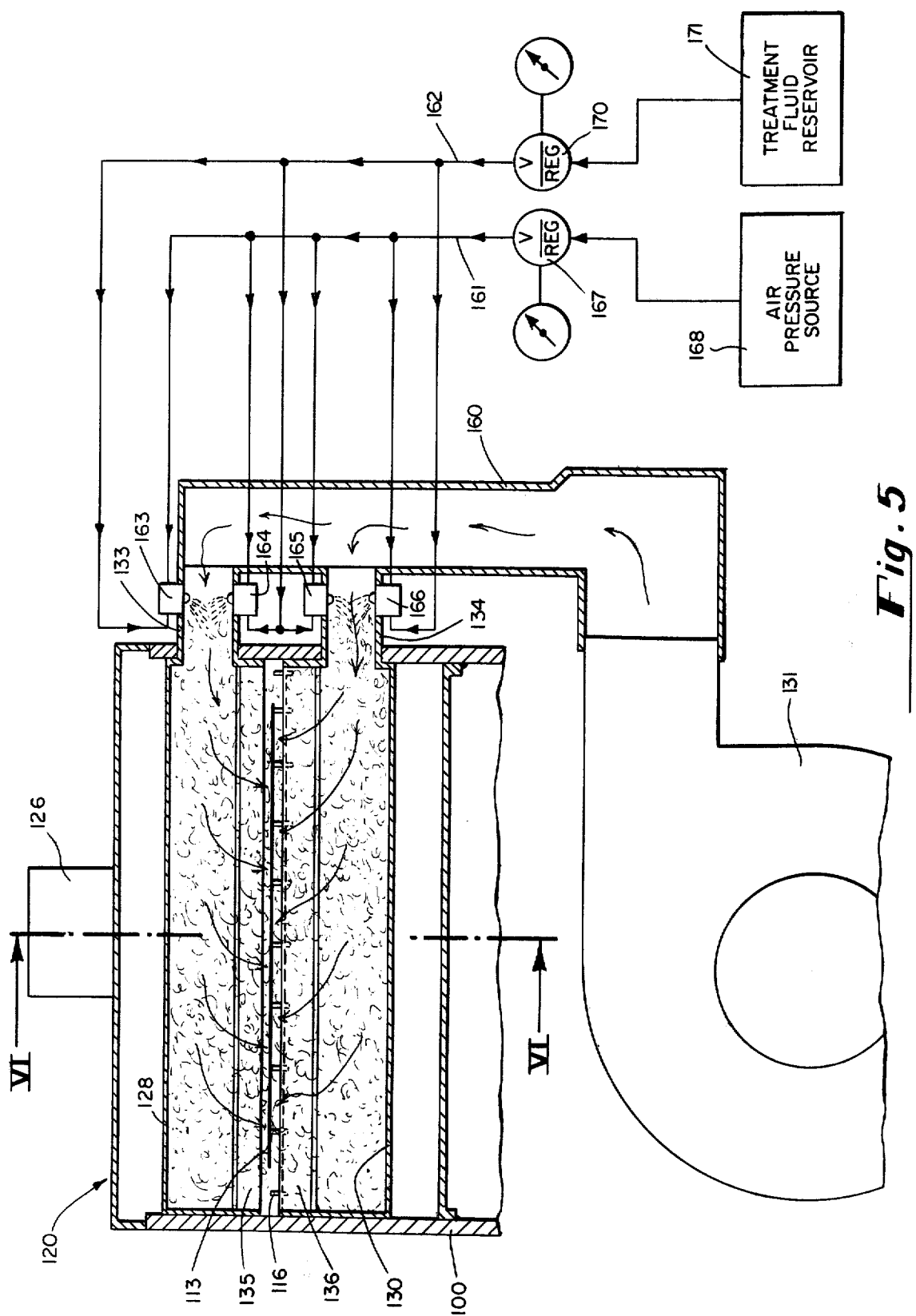

FIG. 5 is an enlarged transverse sectional view of a treatment fluid application station of the present invention, similar to the view in FIG. 2, but showing an alternate embodiment and illustrating the air distribution for facilitating the application of treatment fluid entrained therein, with atomizing heads for entraining very small particles of the treatment fluid as a "mist" in the air distribution stream also being illustrated.

FIG. 6 is a longitudinal sectional view, taken through a treatment fluid application station of FIG. 5, generally along the line VI—VI.

FIG. 7 is an enlarged fragmentary longitudinal sectional view illustrating the details of the air knife configurations utilized for treatment fluid application.

Figure 1:
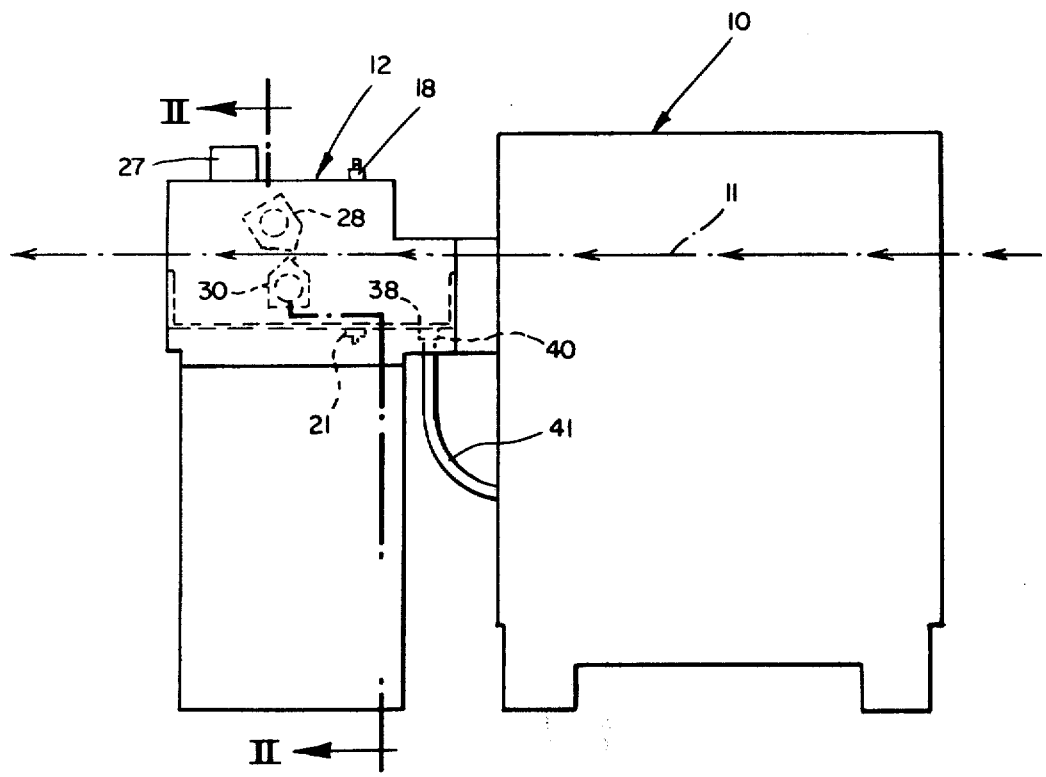
FIG. 1 is a side elevational view of a treatment station with a treatment fluid removal station disposed next thereto, in accordance with this invention, with several components in the later station being illustrated in dotted lines, for the sake of clarity.

Referring now to the drawings in detail, reference is made to a first embodiment of the invention generally showing treatment fluid removal apparatus in FIG. 1, wherein there is illustrated a treatment liquid application station, generally designated by the numeral 10, that may comprise an etching station wherein acid is applied to copper surface portions of printed circuit boards or the like, or with the station 10 comprising a solvent application station or the like for removal of resist, or mask from printed circuit boards or the like. Throughout this application, it will be understood, that wherever the apparatus 10 is referred to as being an etching station, that the same could also be a solvent application station as aforesaid.

Disposed adjacent the station 10, but downstream thereof, as viewed in the direction of flow of a printed circuit board being conveyed as illustrated by the arrow 11, there is provided the removal station 12 of this invention.

Figure 3:
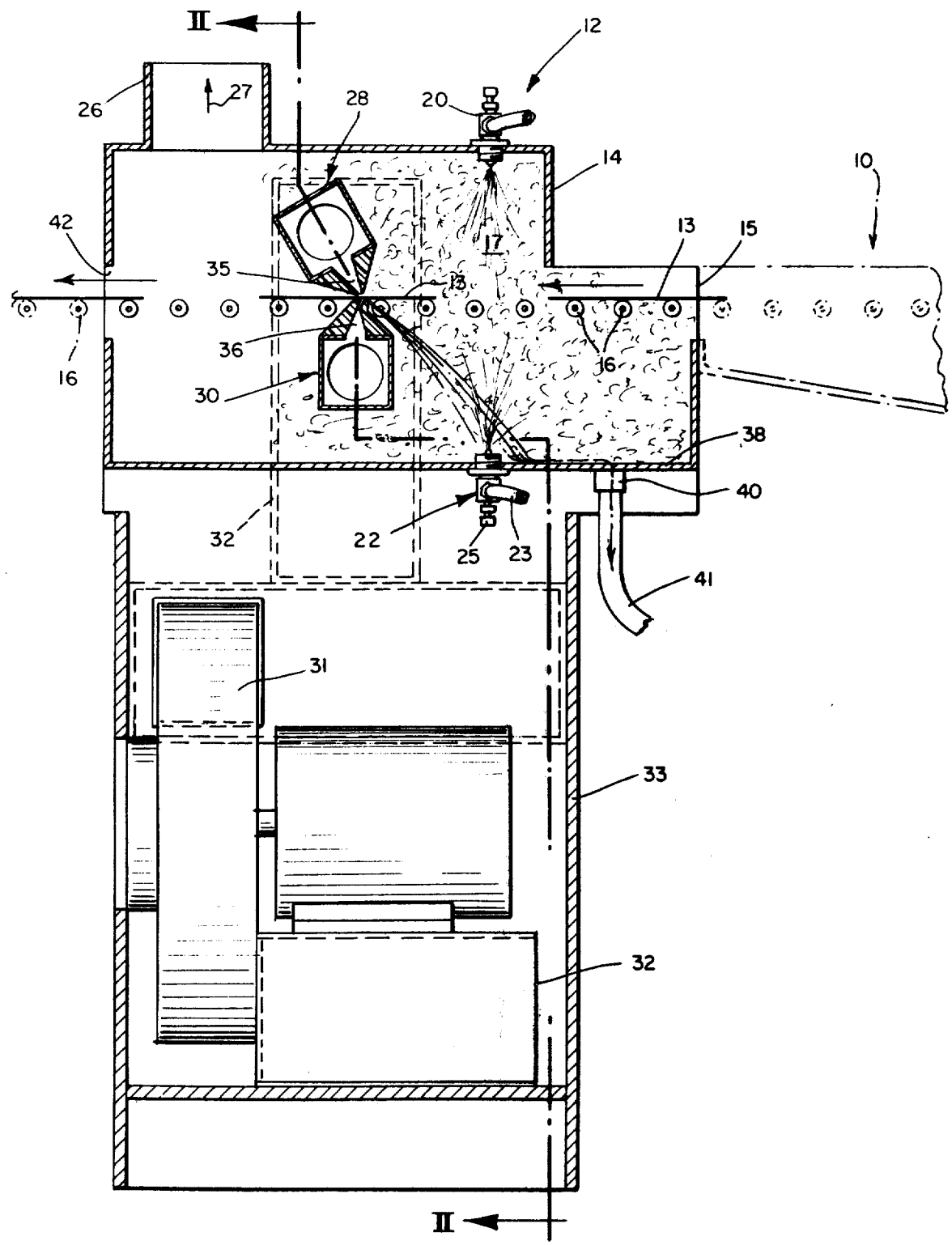
FIG. 3 is a longitudinal sectional view, taken through the apparatus of FIG. 2, generally along the line III—III, of FIG. 2, and wherein the function of the various operative components of the treatment liquid removal apparatus of this invention are more clearly apparent.

With particular reference to FIGS. 2 and 3, it will be apparent that printed circuit boards 13 are delivered to the station 12, passing inwardly of a chamber 14 thereof, through an opening 15, and being carried along a predetermined generally horizontal path by a plurality of driven drive wheels 16, which are driven for rotation in a counterclockwise direction, as viewed in FIG. 3, for passage of the circuit boards 13 from right to left as viewed in FIG. 3.

The boards 13 then pass through a fog zone 17, of moist air, of high relative humidity, preferably as close as possible to, but not exceeding 100% relative humidity. This is to prevent acid or other treatment liquid that is present on the boards 13 from evaporating, or drying on the boards. However, it will be noted that the fog or mist 17 should not surpass 100% relative humidity, as that could dilute the liquid treatment fluid being removed therefrom. The fog or mist is created by emanation or spray of water under pressure from one or more nozzles 18, 20, 21 and 22, each of which is provided with a water inlet 23, a pressurized air inlet 24, and an adjustment device 25, for properly regulating the amount of moisture to be sprayed from an associated said nozzle. While four such spray nozzles 18, 20, 21 and 22 are utilized, it will be apparent that any number may be utilized that will perform the desired function. Accordingly, the nozzles create the high humidity atmosphere 17 within the chamber 14. It will be noted that such atmosphere does not pass rightward through the inlet 15 of the apparatus 12, because of a slight draft or partial vacuum applied at the left upper end of the chamber 14, to a duct 26, such draft amounting to a mere few pounds gauge pressure below atmospheric, in order to provide a direction of gentle flow for the fog 17, in order to prevent excessive buildup of moisture within the chamber 14. Accordingly, the flow of fog 17 is in the direction of the arrow 27.

As the boards 13 are delivered through the zone 17, they pass between streams of gas (preferably air) emanating from upper and lower air knives 28 and 30, for blowing off acid or other treatment liquid from upper and lower surfaces respectively of the boards 13.

Figure 4:
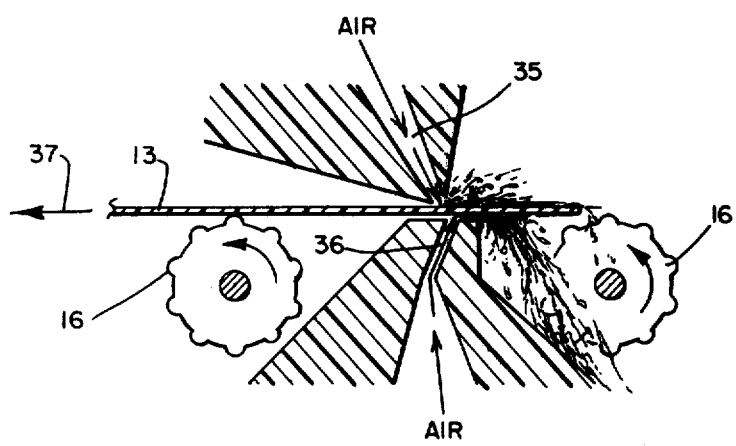
FIG. 4 is an enlarged fragmentary longitudinal sectional view illustrating the details of the air knife configurations utilized to effect the "blow off."

The air knives 28 and 30 are provided with a gas such as pressurized air, by means of a motor driven blower 31, suitably mounted on a support 32 within a base 33 of the apparatus 12, for delivery of a stream of air from the blower 31, upwardly through delivery duct 32, in the direction of the arrows indicated in FIG. 2, for delivery through protruding ends 33 and 34 of the air knives 28 and 30, to be discharged through slit-like orifices 35 and 36, respectively, as is best illustrated in FIG. 4, with the air knives 28 and 30 being angularly oriented, or configured, or both, in order to facilitate a blowing-off of treatment liquid from the boards 13, in a rearwardly direction, relative to the forward direction of movement of the boards 13 indicated by the directional arrow 37, in FIG. 4, for example.

Acid or other treatment liquid thus blown from the boards 13 falls to the bottom wall 38 of the chamber 14, for discharge through a drain 40 thereof, for redelivery to the apparatus 10 through delivery line 41, for re-use as aforesaid.

Printed circuit boards 13 that have passed between air knives 28 and 30 are thus delivered by the rollers 16, through an outlet or discharge 42 of the chamber, generally to a rinsing station or apparatus, whereby rinsing of any residual treatment liquid may be effected, without introducing any substantial amount of treatment liquid into the rinse medium.

It will be apparent that various components of the apparatus of this invention will be constructed of selected materials that are especially selected to prevent deterioration of the same by acids, solvents or the like. Accordingly, utilization of materials such as titanium and various other acid-resistant materials such as plastics like polyvinylchloride or the like will be commonplace.

It will further be noted that the amount of water utilized in formation of the water mist 17 will be of sufficiently low volume to prevent significant dilution of the etchant or other treatment liquid. For example, the water may be atomized with compressed air delivered from an air line at 5 pounds per square inch gauge, at a flow of 3.2 cubic feet/minute. A typical water usage may require 0.75 gallons of water per hour. The air knives may be fed by a centrifugal blower that would be capable of delivering approximately 185 cubic feet/minute at a pressure of 7¼ inches of water. It will be noted that the moist atmosphere is often particularly necessary because the etchant may be heated to 130° Fahrenheit or more, that would otherwise stimulate a high rate of evaporation of water therefrom. Furthermore, other substances such as liquid kerosene or other solvents not miscible with the etchant may be utilized in lieu of water, for delivery to the nozzles, to make a fog or mist. As used herein, therefore the terms "humidity," "fog" and "mist" are not limited to water atmosphere, but can also be atmospheres of other liquids.

It has been found that the function of the apparatus 12 of this invention is highly desirable. In a system wherein printed circuit boards are delivered directly from an etcher, for example, to a rinsing station, without an apparatus of the type 12 of this invention, and with ferric chloride as an etchant, it has been found that, for a particular apparatus, at a conveyor speed of 50 inches per minute, an amount of etchant containing ferric chloride that was delivered to the rinsing station was 2.6 grams of iron per square foot of board, utilizing grams of iron per square foot of board as a measurement of the amount of etchant delivered to the rinsing station. However, when a unit of the type of this invention was inserted between the etching apparatus and the rinsing apparatus, only 0.02 grams of iron per square foot of board was delivered to the rinsing station, again using the iron content as a fair measurement of the amount of ferric chloride etchant that was delivered to the rinsing station. From this iron value, the copper content of the etchant can be computed because it would be proportionately equivalent to the copper content of the ferric chloride etchant. Thus, it will be apparent that there is approximately a reduction by a factor of 100 or more, in the amount of etchant remaining on the boards, as residue, with the utilization of the apparatus of this invention.

It will further be noted that the air knives 28 and 30 of this invention may take on any desired shapes or configurations, such as being completely cylindrical, rather than of the generally rectangular cross-section illustrated, as desired, and their placement and orientations may vary, as long as the streams of air emanating therefrom function to blow-off the treatment liquid, while the affected portions of the boards 13 are still within the high humidity environment. Also, it will be apparent that the air streams emanating through the openings 35 and 36 of the knives 28 and 30 may be continuous between opposite sidewalls of the chamber 14, or, if rigidity of the construction of the air knives 28 and 30 is a concern, a plurality of slits or holes of other types, may be utilized, across the apparatus 12, between sidewalls thereof.

Also, while printed circuit boards are identified as being the articles from which the treatment fluid is "blown-off," it will be apparent that other members, such as flexible printed circuits, or even members that are not printed circuits may employ the advantages of this invention.

The second embodiment of the present invention provides a novel method for the application of a treatment fluid to an article, wherein a minimal amount of the treatment fluid is required for economical, efficient and uniform application to a generally planar article.

This invention provides a method whereby treatment fluids are applied by a "wet" air knife technique, which is utilized in the operation of the treatment fluid application station 120. Since only a small quantity of treatment fluid is required, it is not economically necessary, unless specifically desired, to recirculate the solution, or attempt to remove any contamination build-up resulting from water, solvents, or prior treatments still remaining on the article as it passes through the application station.

Furthermore, when only a very low volume application is desired, such as a small quantity of chemical treatment, paint, or the like, a thin film of the treatment can be applied by this "wet" air knife technique. It should be noted, that the term "wet," as used herein, refers not only to the presence of a liquid, but furthermore to the presence of any fluid material, including liquids, liquids entrained in gases, and the like.

One example of the application method disclosed herein is directed to the application of a dilute solution of hydrochloric acid treatment fluid to a printed circuit board 113 for the purpose of neutralizing and rinsing off an alkaline etchant contained thereon.

Now with particular reference to FIGS. 5 and 6, a printed circuit board 113 is delivered to application station 120, passing inwardly of a chamber 114 thereof, through an inlet 115 and is carried along a predetermined, generally horizontal path by a plurality of driven drive wheels 116 which are driven for rotation in a counterclockwise direction as viewed in FIG. 7 for passage of the printed circuit board 113 from right to left, in direction 111 as viewed in FIG. 6.

As the printed circuit board 113 is delivered through the chamber 114, it is passed between streams of gas, preferably air, in which very small particles, (hereinafter referred to as "atomized particles"), of treatment fluid are entrained. These streams of gas are discharged from openings in upper and lower air knives 128 and 130, respectively, which blow the entrained, atomized particles of treatment fluid onto the upper and lower surfaces, respectively, of the printed circuit board 113, whereby the treatment fluid is delivered and applied thereto.

The air knives 128 and 130 are provided with a stream of gas, such as pressurized air, by means of a motor driven blower 131 which may be suitably mounted on support base 100 of the application station 120, upwardly through delivery duct 160, in the direction of arrows indicated in FIG. 5, for delivery through protruding ends 133 and 134 of air knives 128 and 130, respectively, to be distributed therethrough. Alternatively, air or other gas may be provided by a compressed gas cylinder or other source, rather than the blower 131.

Protruding ends 133 and 134 are provided with atomizing means 163 and 164, and 165 and 166, respectively. It will be readily apparent that any practical number or configuration of such atomizing means may be utilized in the practice of this embodiment of the invention. Atomizing means 163, 164, 165 and 166 are configured so as to produce very small particles of treatment fluid within protruding ends 133 and 134, whereby a mist of atomized treatment fluid will be entrained in the stream of gas passing therethrough, as best shown in FIG. 5, with directional arrows indicating the mist flow.

The atomizing means 163, 164, 165, and 166 are supplied with pressurized air from a separate air pressure source 168 through pressurized air line 161, which is provided with a regulatory valve 167 and the same are also supplied with treatment fluid, either at normal or elevated pressure, from a treatment fluid reservoir 171 through treatment fluid line 162, which is provided with a regulatory valve 170. The mist of atomized treatment fluid is created by atomizing means 163, 164, 165 and 166 as the pressurized air and treatment fluid are brought together therein at rates regulated by valves 167 and 170, respectively.

The mist of atomized treatment fluid produced by atomizing means 163, and 164, and 165 and 166, and entrained in the stream of gas which is swept through air knives 128 and 130, respectively, is discharged through slit-like orifices 135 and 136, and thereby "blown-on" and applied to circuit board 113. This is best illustrated in FIG. 7, with air knives 128 and 130 being angularly oriented, or configured, in order to facilitate application of a mist of atomized treatment fluid through the air knives onto circuit board 113 in a rearwardly direction, relative to the forward direction of movement of the printed circuit board 113, indicated by the directional arrow 137 in FIG. 7. The angular orientation of air knives 128 and 130 may, of course, vary even to be forwardly directed, if desired.

Printed circuit boards 113 that have passed between air knives 128 and 130 and had treatment fluid applied thereby are transported by driven drive wheels 116, through an outlet, or discharge, 142 of chamber 114, generally to a rinsing station or further treatment station.

It will be fully apparent to one skilled in the art that the application method of the present invention is not limited to the preferred embodiment, but also fully encompasses the application of any treatment fluid to any article in accordance with the present invention. Examples of various specific embodiments of the method of the present invention include the application of a dilute hydrochloric acid solution to a printed circuit board for rinsing of an alkaline etchant therefrom, application of a dilute chromic acid solution for passivating metals to an appropriate metal article, application of an aqueous solution of $CrO_3$ to panels of aluminum or steel, application of developer solutions to an aqueous base dry film photoresist after ultra-violet exposure, application of solutions of acid to etched metals, such as applying 42° Be ferric chloride solution to copper, application of a dilute sodium persulfate solution to copper for removal of oxide film, and application of cleaning solutions, including detergents, to remove dirt and dust from plastic sheets. All of the foregoing specific treatment fluids applied in accordance with the present invention are understood to be "chemical treatment fluids," although the term is not limited solely thereto. Also, for purposes of this invention, an etchant may be any chemical treatment fluid which is useful for etching metal surfaces, including ferric chloride, cupric chloride, ammonium persulfate, sodium persulfate, chromic-sulfuric acid (in any ratio of chromic to sulfuric acid), and ammoniated etchants.

Among the advantages of the application method of the present invention is that the treatment agent supply does not become progressively contaminated, as it would if the treatment fluid were applied by a recirculating system, such as is now used in the present state of the art. For example, if treatment fluid is applied to an article by a recirculating system approximately 20 gallons of treatment fluid per minute would be required, a significant portion of which would become contaminated and require reclamation.

However, applying the treatment fluid by the method of the present invention, in one example, only 4 gallons per hour would be required to uniformly apply a coating on both sides of a 20 inch, 600 foot long strip of metal, without significant waste. Therefore, as a result of reduced waste, and the elimination of any significant excess of treatment fluid in which contamination builds-up, it is not economically necessary to recirculate or reclaim the same.

It will be apparent from the foregoing that various modifications may be made in the details of construction, as well as in the use and operation of the apparatus and method of this invention, all within the spirit and scope of the appended claims.

What is claimed is:

1. A process for application of a film of chemical treatment fluid to an article wherein the film is of improved uniformity, comprising the steps of:
    A. providing a stream of gas having atomized particles of a treatment fluid entrained therein;
    B. moving said article along a predetermined generally planar path through a chamber; and
    C. exposing said article to said stream of gas by blowing a thin stream of said gas directly thereon across the path, through gas knife means that extend across the path, whereby a thin film of said entrained treatment fluid is applied directly to said article, while the article is moving along its generally planar path.

2. The process of claim 1, wherein said atomized particles are produced by the steps of:
    A. providing a source of pressurized gas to the said gas knife means from outside the chamber;
    B. providing a source of said treatment fluid to the said gas knife means closely adjacent discharge portions thereof; and
    C. combining said pressurized gas and said treatment fluid in a suitable means for producing atomized particles of said treatment fluid directly prior to delivery of the gas and atomized particles to the gas knife means.

3. The process of claim 1, wherein said atomized particles are entrained in said stream of gas by producing said atomized particles in a zone through which said stream of gas is simultaneously passed.

4. The process of claim 1, wherein said article being treated is a printed circuit board member having an alkaline etchant thereon and said treatment fluid comprises a hydrochloric acid solution.

5. The process of claim 1, wherein the article being treated is a printed circuit board member having a dry film of photoresist thereon and said treatment fluid comprises a developer solution therefor, with said photoresist having previously been exposed to ultra-violet radiation.

6. The process of claim 1, wherein said article being treated is a metal article and said treatment fluid is comprised of an etchant solution.

7. The process of claim 6, wherein said metal article is copper and etchant solution contains an etchant selected from the group consisting of ferric chloride, cupric chloride, ammonium persulfate, sodium persulfate, and a chromic-sulfuric acid.

8. The process of claim 6, wherein said metal article is copper and said etchant solution contains an etchant selected from the group consisting of ferric chloride, cupric chloride, ammonium persulfate, sodium persulfate, a chromic-sulfuric acid, and ammoniated etchant.

9. The process of claim 1, wherein said article being treated is a plastic article and said treatment fluid is a detergent cleaning solution.

10. The process of claim 1, wherein said article being treated is a steel article and said treatment fluid comprises a chromic acid solution for passivating said steel.

11. The process of claim 1, wherein said treatment fluid comprises a solution of a film-forming coating composition.

12. The process of claim 11, wherein said solution of film-forming coating composition is paint.

13. A process for application of a film of a chemical treatment fluid of improved uniformity to a series of generally planar articles comprising steps of:
  A. providing a chamber of predetermined width and having a generally planar path for conveyance of generally planar articles therethrough;
  B. driving conveying means associated with said chamber so as to convey said articles in a direction generally from an inlet to an outlet thereof along the planar path;
  C. providing a stream of gas from outside the chamber for conveying a mist of said chemical treatment fluid;
  D. providing a separate source of pressurized gas and a separate source of said chemical treatment fluid;
  E. combining said pressurized gas and said chemical treatment fluid in a suitable means for atomizing particles of said chemical treatment fluid directly prior to delivery of the gas and atomized particles to a mist delivery means;
  F. entraining said atomized particles of said chemical treatment fluid in said stream of gas, whereby a mist of said chemical treatment fluid is produced;
  G. distributing said mist in a thin film through at least one mist delivery means within said chamber, said mist delivery means being of the gas knife type and a narrow opening therein configured to extend generally across the width of said path; and
  H. conveying said articles upon which said chemical treatment fluid is to be applied along said path past said narrow opening in said mist delivery means, whereby said mist is discharged from said opening and said particles of said chemical treatment fluid entrained in said mist are uniformly applied to said articles.

14. A process of claim 13, wherein at least one said mist delivery means is provided with said opening generally above said path, and at least one said mist delivery means is provided with said opening generally below said path, whereby said chemical treatment fluid is applied both to the upper and lower surfaces of said articles as said articles are conveyed along said path.

15. The process of claim 13, wherein said article being treated is a printed circuit board member having an alkaline etchant thereon and said treatment fluid comprises a hydrochloric acid solution.

16. The process of claim 13, wherein the article being treated is a printed circuit board member having a dry film of photoresist thereon and said treatment fluid comprises a developer solution therefor, with said photoresist having previously been exposed to ultra-violet radiation.

17. The process of claim 13, wherein said article being treated is a metal article and said treatment fluid is comprised of a etchant solution.

18. The process of claim 17, wherein said metal article is copper and etchant solution contains an etchant selected from the group consisting of ferric chloride, cupric chloride, ammonium persulfate, sodium persulfate, and a chromic-sulfuric acid.

19. The process of claim 17, wherein said metal article is copper and said etchant solution contains an etchant selected from the group consisting of ferric chloride, cupric chloride, ammonium persulfate, sodium persulfate, a chromic-sulfuric acid, and ammoniated etchant.

20. The process of claim 13, wherein said article being treated is a plastic article and said treatment fluid is a detergent cleaning solution.

21. The process of claim 13, wherein said article being treated is a steel article and said treatment fluid comprises a chromic acid solution for passivating said steel.

22. The process of claim 13, wherein said treatment fluid comprises a solution of a film-forming coating composition.

23. The process of claim 22, wherein said solution of film-forming coating composition is paint.

* * * * *